US012707902B2

(12) United States Patent
Hsu et al.

(10) Patent No.: US 12,707,902 B2
(45) Date of Patent: Aug. 11, 2026

(54) RESISTIVE RANDOM-ACCESS MEMORY DEVICE

(71) Applicant: UNITED MICROELECTRONICS CORP., Hsin-Chu City (TW)

(72) Inventors: Chia-Ching Hsu, Yunlin County (TW); Wang Xiang, Singapore (SG); Shen-De Wang, Hsinchu County (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 190 days.

(21) Appl. No.: 18/658,937

(22) Filed: May 8, 2024

(65) Prior Publication Data

US 2024/0292765 A1 Aug. 29, 2024

Related U.S. Application Data

(63) Continuation of application No. 17/196,979, filed on Mar. 9, 2021, now Pat. No. 12,010,931.

(30) Foreign Application Priority Data

Feb. 1, 2021 (TW) ................................ 110103697

(51) Int. Cl.
*H10N 70/00* (2023.01)
*H10B 63/00* (2023.01)

(52) U.S. Cl.
CPC ......... *H10N 70/841* (2023.02); *H10B 63/845* (2023.02); *H10N 70/021* (2023.02); *H10N 70/066* (2023.02); *H10N 70/8833* (2023.02)

(58) Field of Classification Search
CPC . H10N 70/823; H10N 70/826; H10N 70/8265
See application file for complete search history.

(56) References Cited

U.S. PATENT DOCUMENTS

| | | | | |
|---|---|---|---|---|
| 9,564,587 | B1 | 2/2017 | Jo | |
| 9,923,028 | B1 | 3/2018 | Hsu | |
| 10,700,129 | B2 | 6/2020 | Ando | |
| 11,793,004 | B2 | 10/2023 | Loy | |
| 12,010,931 | B2 | 6/2024 | Hsu | |
| 12,156,487 | B2 * | 11/2024 | Hsu | H10N 70/20 |
| 2003/0129799 | A1 | 7/2003 | Nam | |
| 2008/0079049 | A1 | 4/2008 | Lee | |
| 2013/0168634 | A1 | 7/2013 | Lee | |
| 2013/0336042 | A1 | 12/2013 | Lee | |
| 2015/0028281 | A1 | 1/2015 | Chen | |

(Continued)

FOREIGN PATENT DOCUMENTS

| | | | |
|---|---|---|---|
| CN | 102244194 | A | 11/2011 |
| CN | 103199193 | A | 7/2013 |
| CN | 103811656 | A | 5/2014 |

(Continued)

*Primary Examiner* — Mark V Prenty
(74) *Attorney, Agent, or Firm* — Winston Hsu

(57) ABSTRACT

A RRAM (resistive random-access memory) device includes a bottom electrode line directly on a first metal structure, a top electrode island disposed beside the bottom electrode line, a resistive material sandwiched by a sidewall of the bottom electrode line and a sidewall of the top electrode island, and a cap layer covering a portion of the first metal structure and under the bottom electrode line.

16 Claims, 7 Drawing Sheets

(56) References Cited

U.S. PATENT DOCUMENTS

| | | | |
|---|---|---|---|
| 2020/0098982 | A1 | 3/2020 | Chuang |
| 2020/0127189 | A1 | 4/2020 | Liao |

FOREIGN PATENT DOCUMENTS

| | | | |
|---|---|---|---|
| CN | 104637971 | A | 5/2015 |
| CN | 105390611 | A | 3/2016 |
| CN | 107039483 | A | 8/2017 |
| CN | 108123034 | A | 6/2018 |
| CN | 109427968 | A | 3/2019 |
| CN | 110957422 | A | 4/2020 |
| CN | 111613572 | A | 9/2020 |
| JP | 2010-161174 | A | 7/2010 |
| JP | 2014-22488 | | 2/2014 |
| TW | I442612 | B | 6/2014 |
| TW | 201729414 | A | 8/2017 |

* cited by examiner

6(a)

6(b)

A
A'
140
H
H
A
H
A'
130
134
132
120
T
140
10a
10a
10b
110
10

RESISTIVE RANDOM-ACCESS MEMORY DEVICE

CROSS REFERENCE TO RELATED APPLICATIONS

This application is a continuation application of U.S. application Ser. No. 17/196,979, filed on Mar. 9, 2021. The content of the application is incorporated herein by reference.

BACKGROUND OF THE INVENTION

1. Field of the Invention

The present invention relates to a resistive random-access memory (RRAM) device and forming method thereof, and more particularly, to a vertical resistive random-access memory (RRAM) device and forming method thereof.

2. Description of the Prior Art

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a resistive random-access memory (RRAM) device and forming method thereof, which forms a memory cell including vertical resistance layers parallel to each other and sandwiched by a top electrode island and bottom electrodes, thereby saving memory cells area, and avoiding the top electrode island from connecting to the bottom electrodes by a metal structure above the memory cell.

The present invention provides a resistive random-access memory (RRAM) device including a bottom electrode line, a top electrode island and a resistive material. The bottom electrode line is directly on a first metal structure. The top electrode island is disposed beside the bottom electrode line. The resistive material is sandwiched by a sidewall of the bottom electrode line and a sidewall of the top electrode island.

The present invention provides a method of forming a resistive random-access memory (RRAM) device including the following steps. A bottom electrode layer and a dielectric hard mask layer are deposited on the first metal structure sequentially. The dielectric hard mask layer and the bottom electrode layer are patterned to form stack structures including bottom electrode lines and a dielectric layer. An inter-dielectric layer is formed on the first metal structure beside the bottom electrode lines, and a through hole is surrounded by the bottom electrode lines and the inter-dielectric layer. A resistive material conformally covers the through hole and a top electrode fills up the through hole, thereby the bottom electrode lines, the resistive material and the top electrode constituting a RRAM cell.

According to the above, the present invention provides a resistive random-access memory (RRAM) device and forming method thereof, which forms two bottom electrode lines directly on a first metal structure, an inter-dielectric layer disposed between the bottom electrode lines, through holes surrounded by the inter-dielectric layer and the bottom electrode lines, a resistive material and a vertical top electrode sequentially filling in the through holes, to constitute a RRAM cell including the resistive material having a U-shape cross-sectional profile. In this way, the resistive material including two parallel resistive layers, meaning two vertical parts of the U-shape cross-sectional profile, can save each cell area. Moreover, the resistive material can be prevented from being damaged and the connecting of the bottom electrode lines and the vertical top electrode by an above metal structure contacting the RRAM cell can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
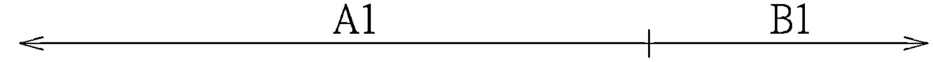
FIG. 1 schematically depicts a cross-sectional view of a method of forming a vertical resistive random-access memory (RRAM) device according to an embodiment of the present invention.
Figure 1:
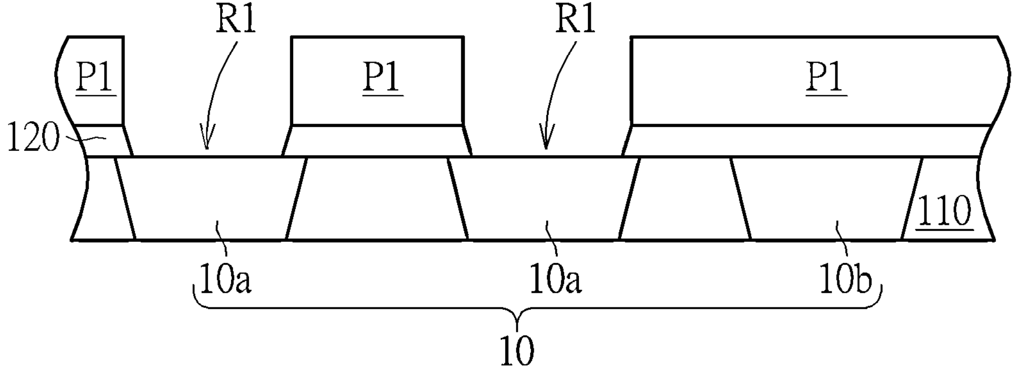

FIGS. 1-9 schematically depict cross-sectional views of a method of forming a vertical resistive random-access memory (RRAM) device according to an embodiment of the present invention. As shown in FIG. 1, a dielectric layer 110 is formed on a substrate (not shown), wherein the substrate may be a silicon substrate, a silicon containing substrate, a III-V group-on-silicon (such as GaN-on-silicon) substrate, a silicon carbide substrate, an aluminum oxide substrate, a graphene-on-silicon substrate or a silicon-on-insulator (SOI) substrate. In this embodiment, the substrate may include a first area A1 and a second area B1, wherein the first area A1 is a resistive random-access memory area, and the second area B1 is a logic area, but it is not limited thereto. A first metal structure 10 is located in the dielectric layer 110, wherein the first metal structure 10 may include first metal wires 10*a* in the dielectric layer 110 of the first area A1, and a first metal wire 10*b* in the dielectric layer 110 of the second area B1. Methods of forming the first metal structure 10 in the dielectric layer 110 are well known in the art, and are not described.

A cap layer 120 is deposited and patterned on the first metal structure 10 and the dielectric layer 110, so that the cap layer 120 has openings R1 to expose the first metal structure 10. More precisely, a cap layer (not shown) is deposited blanketly and a patterned photoresist P1 is formed to cover the cap layer, and then the cap layer is patterned to form the cap layer 120 having the openings R1. Thereafter, the patterned photoresist P1 is removed. In a preferred embodiment, the cap layer 120 includes a nitrogen containing silicon carbide (SiCN) layer, but it is not limited thereto.

Figure 2:
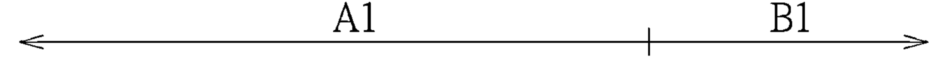
FIG. 2 schematically depicts a cross-sectional view of a method of forming a vertical resistive random-access memory (RRAM) device according to an embodiment of the present invention.
Figure 2:
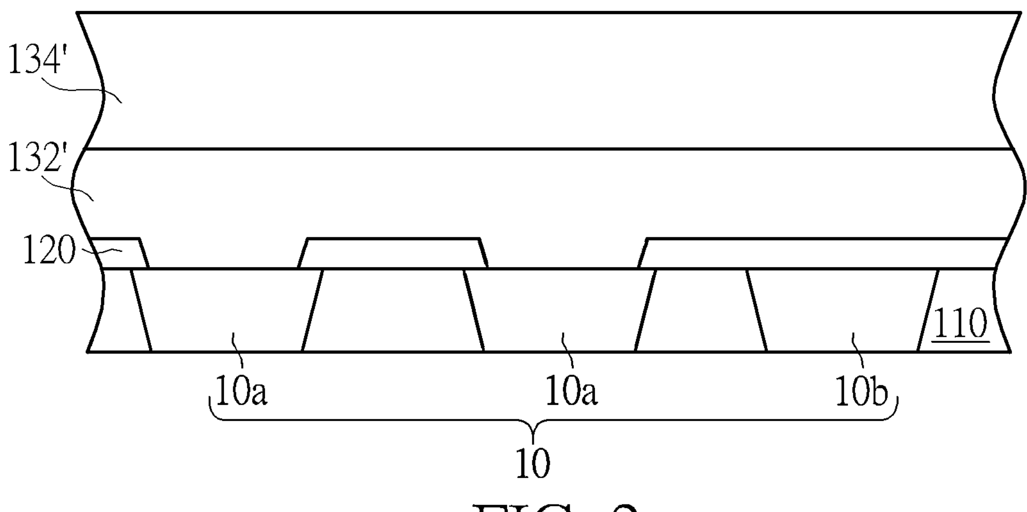
Figure 3:
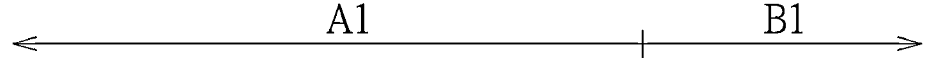
FIG. 3 schematically depicts a cross-sectional view of a method of forming a vertical resistive random-access memory (RRAM) device according to an embodiment of the present invention.
Figure 3:
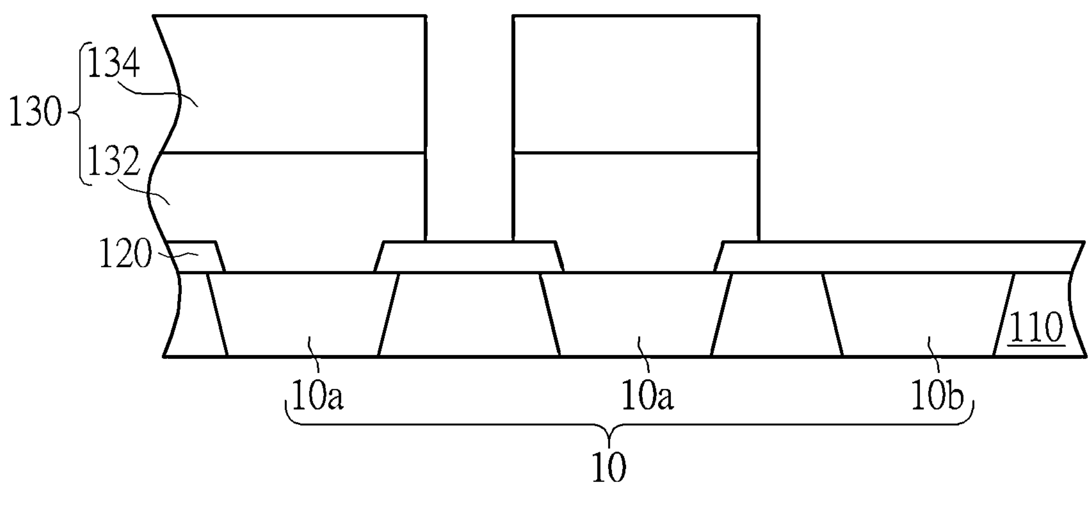

As shown in FIG. 2, a bottom electrode layer 132' and a dielectric hard mask layer 134' are sequentially deposited on the first metal structure 10 and the dielectric layer 110. As shown in FIG. 3, the dielectric hard mask layer 134' and the bottom electrode layer 132' are patterned to form stack structures 130 on the first metal structure 10 of the first area A1, wherein the stack structures 130 may include bottom electrode lines 132 and a dielectric layer 134. In a preferred embodiment, the bottom electrode lines 132 include metal alloys composed of aluminum, aluminum titanium or cobalt titanium etc, and the dielectric layer 134 may include a silicon nitride layer, but it is not limited thereto. Due to the cap layer 120 having the openings R1, the bottom electrode lines 132 in the stack structures 130 physically connect the first metal wires 10*a* of the first metal structure 10.

Figure 4:
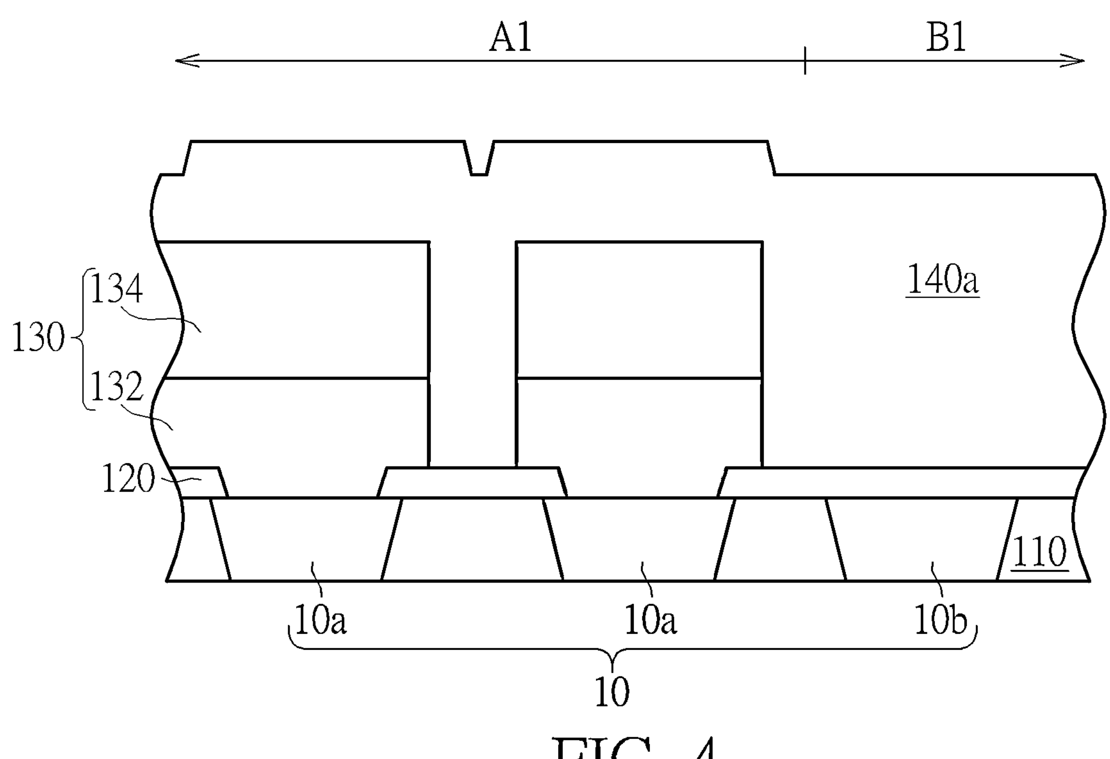
FIG. 4 schematically depicts a cross-sectional view of a method of forming a vertical resistive random-access memory (RRAM) device according to an embodiment of the present invention.
Figures 5, 6:
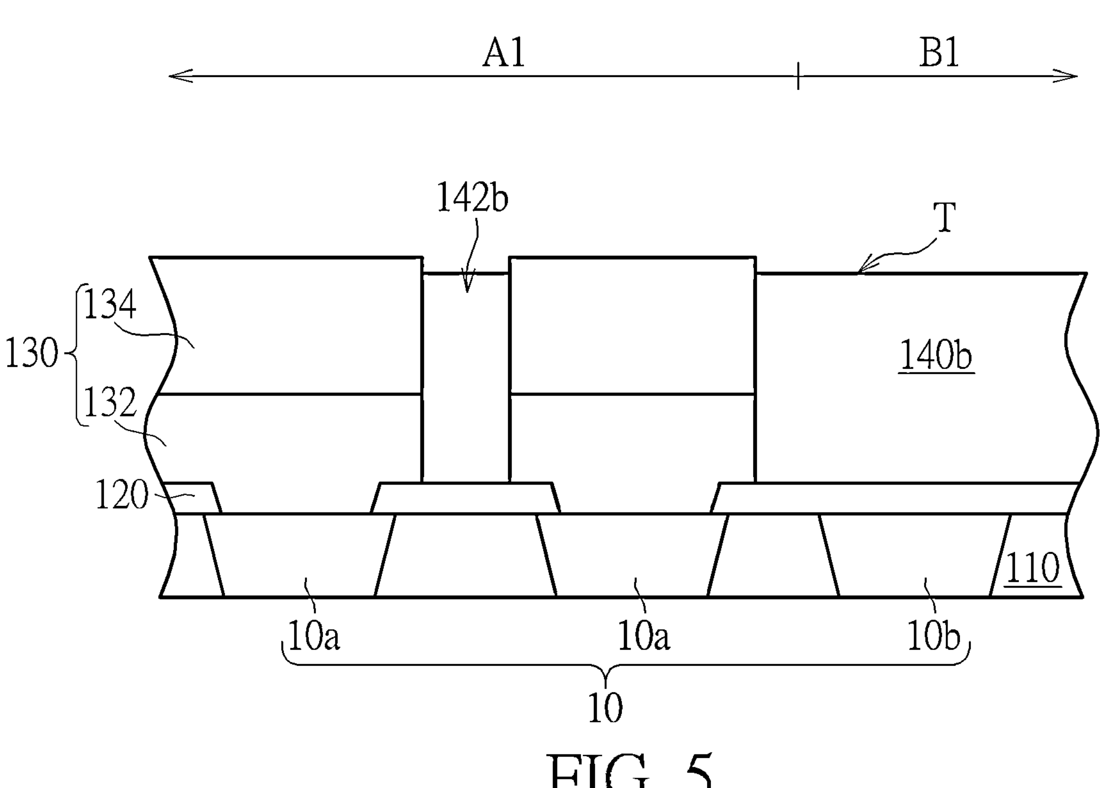
FIG. 5 schematically depicts a cross-sectional view of a method of forming a vertical resistive random-access memory (RRAM) device according to an embodiment of the present invention.
FIG. 6 schematically depicts a cross-sectional view of a method of forming a vertical resistive random-access memory (RRAM) device according to an embodiment of the present invention.

Please refer to FIGS. 4-6, an inter-dielectric layer 140 is formed on the first metal structure 10 and the dielectric layer 110 beside the bottom electrode lines 132 and the dielectric layer 134, and through holes H are surrounded by the bottom electrode lines 132 and the inter-dielectric layer 140. As shown in FIG. 4, after the steps of FIGS. 2-3—patterning the dielectric hard mask layer 134' and the bottom electrode layer 132', a first dielectric layer 140*a* is blanketly deposited on the first metal structure 10 and the dielectric layer 110 beside the bottom electrode lines 132. Then, the first dielectric layer 140*a* is planarized to form a second dielectric layer 140*b*, wherein the second dielectric layer 140*b* has a flat top surface T, as shown in FIG. 5. For clarifying the present invention, FIG. 6 includes a top view FIG. 6(*a*), and a cross-sectional view FIG. 6(*b*) along line AA' of FIG. 6(*a*). As shown in FIG. 6, a part 142*b* of the second dielectric layer 140*b* between the bottom electrode lines 132 is removed, and thus through holes H surrounded by the bottom electrode lines 132 and the inter-dielectric layer 140 being formed.

Figure 7:
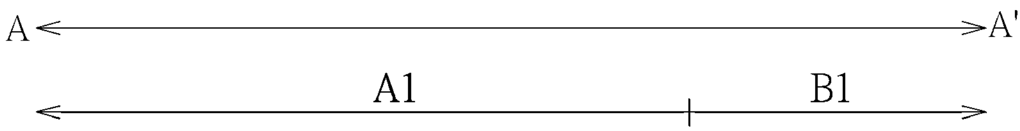
FIG. 7 schematically depicts a cross-sectional view of a method of forming a vertical resistive random-access memory (RRAM) device according to an embodiment of the present invention.
Figure 7:
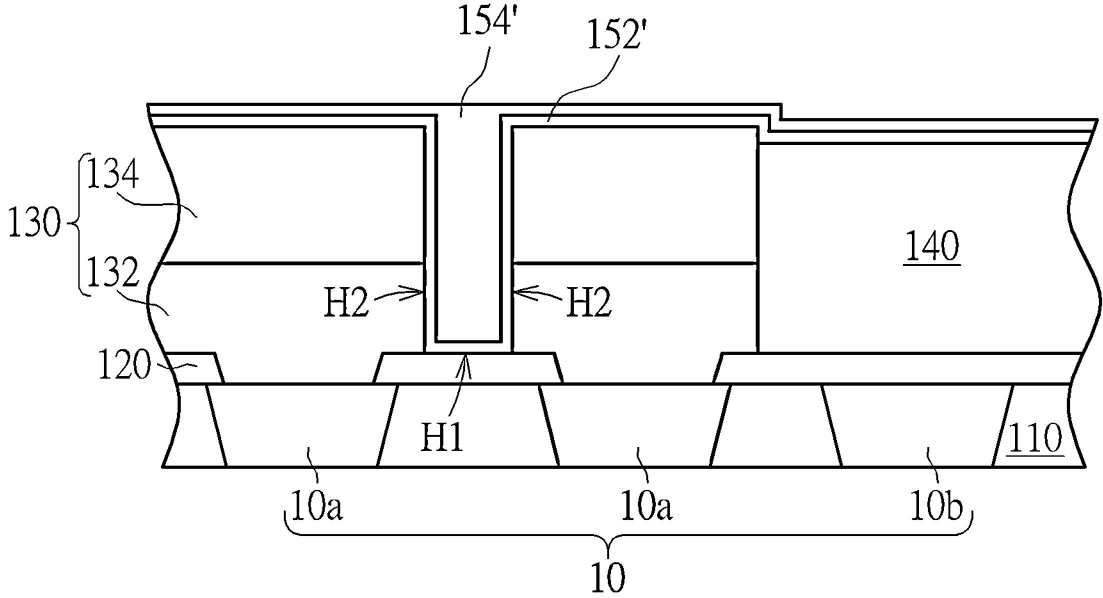
Figure 8:
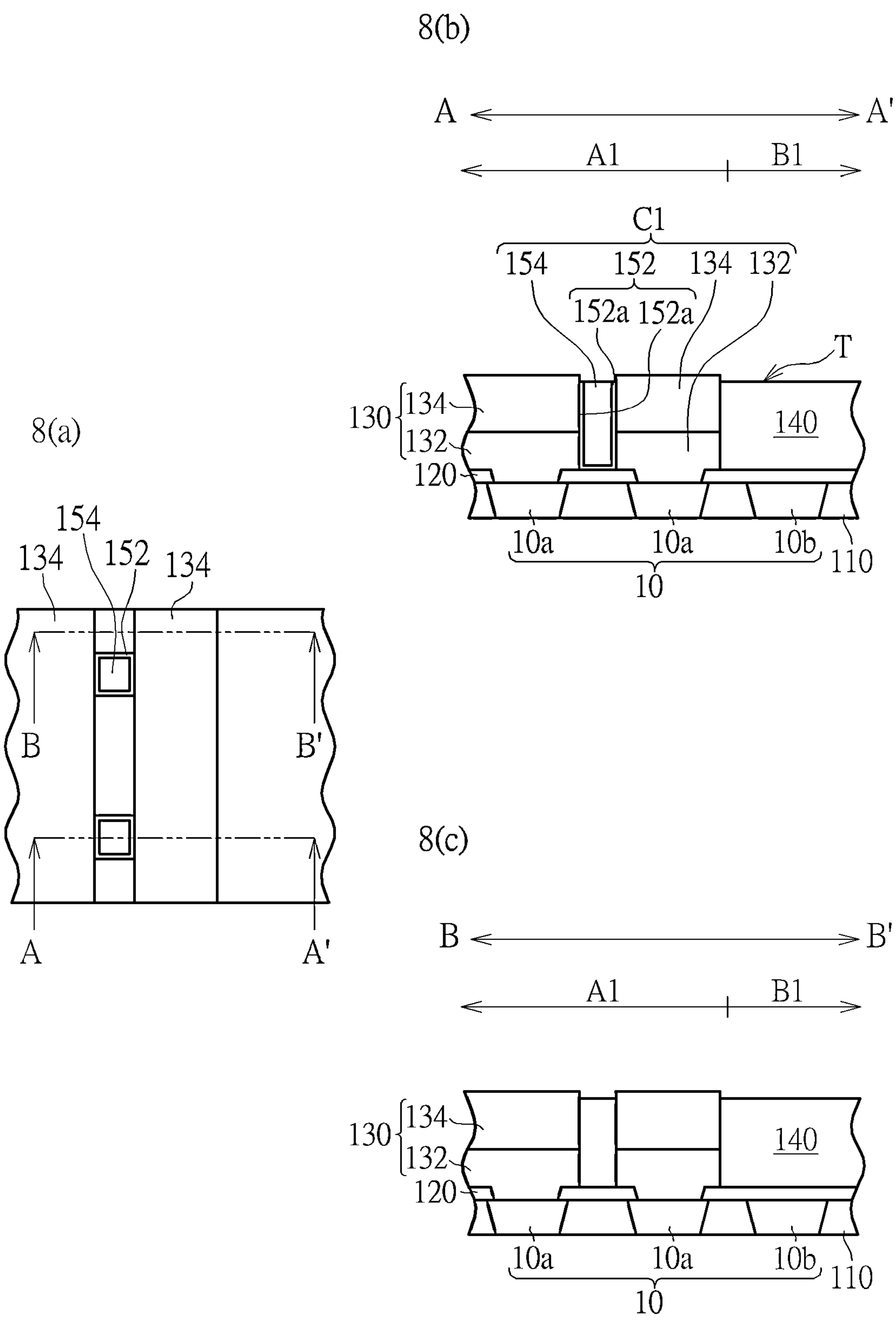
FIG. 8 schematically depicts a cross-sectional view of a method of forming a vertical resistive random-access memory (RRAM) device according to an embodiment of the present invention.

Please refer to FIGS. 7-8, a resistive material 152 fills in and conformally covers the through holes H, and a vertical top electrode 154 fills up the through holes H, therefore a RRAM cell C1 constituting the bottom electrode lines 132, the resistive material 152 and the vertical top electrode 154 is carried out. The resistive material 152 may include transition-metal-oxide (TMO), but it is not limited thereto. More precisely, as shown in FIG. 7, a resistive material layer 152' and a top electrode layer 154' are sequentially deposited to cover the through holes H, the dielectric layer 134 and the inter-dielectric layer 140, wherein the resistive material layer 152"conformally covers bottoms H1 and sidewalls H2 of the through holes H, and the top electrode layer 154' fills up the through holes H.

For clarifying the present invention, FIG. 8 includes a top view FIG. 8(*a*), and a cross-sectional view FIG. 8(*b*) along line AA' of FIG. 8(*a*) and a cross-sectional view FIG. 8(*c*) along line BB' of FIG. 8(*a*). The top electrode layer 154' and the resistive material layer 152' exceeding from the through holes H are removed to form the resistive material 152 and the vertical top electrode 154, as shown in FIG. 8. Thus, the bottom electrode lines 132, the resistive material 152 and the vertical top electrode 154 constitute the RRAM cell C1. The resistive material 152 has a U-shape cross-sectional profile, and the vertical top electrode 154 is a top electrode island. The RRAM cell C1 includes two parallel resistive layers, meaning vertical parts 152*a* of the U-shape cross-sectional profile, to save memory cells area. As shown in FIG. 8(*b*), the resistive material 152 and the vertical top electrode 154 are depicted, but there is only the inter-dielectric layer 140 between the bottom electrode lines 132 in FIG. 8(*c*).

In another preferred embodiment, the dielectric layer 134 composed of silicon nitride may be removed after the RRAM cell C1 is formed, and is replaced by an oxide layer or a dielectric layer having a low dielectric constant, to reduce parasitic capacitance.

Figure 9:
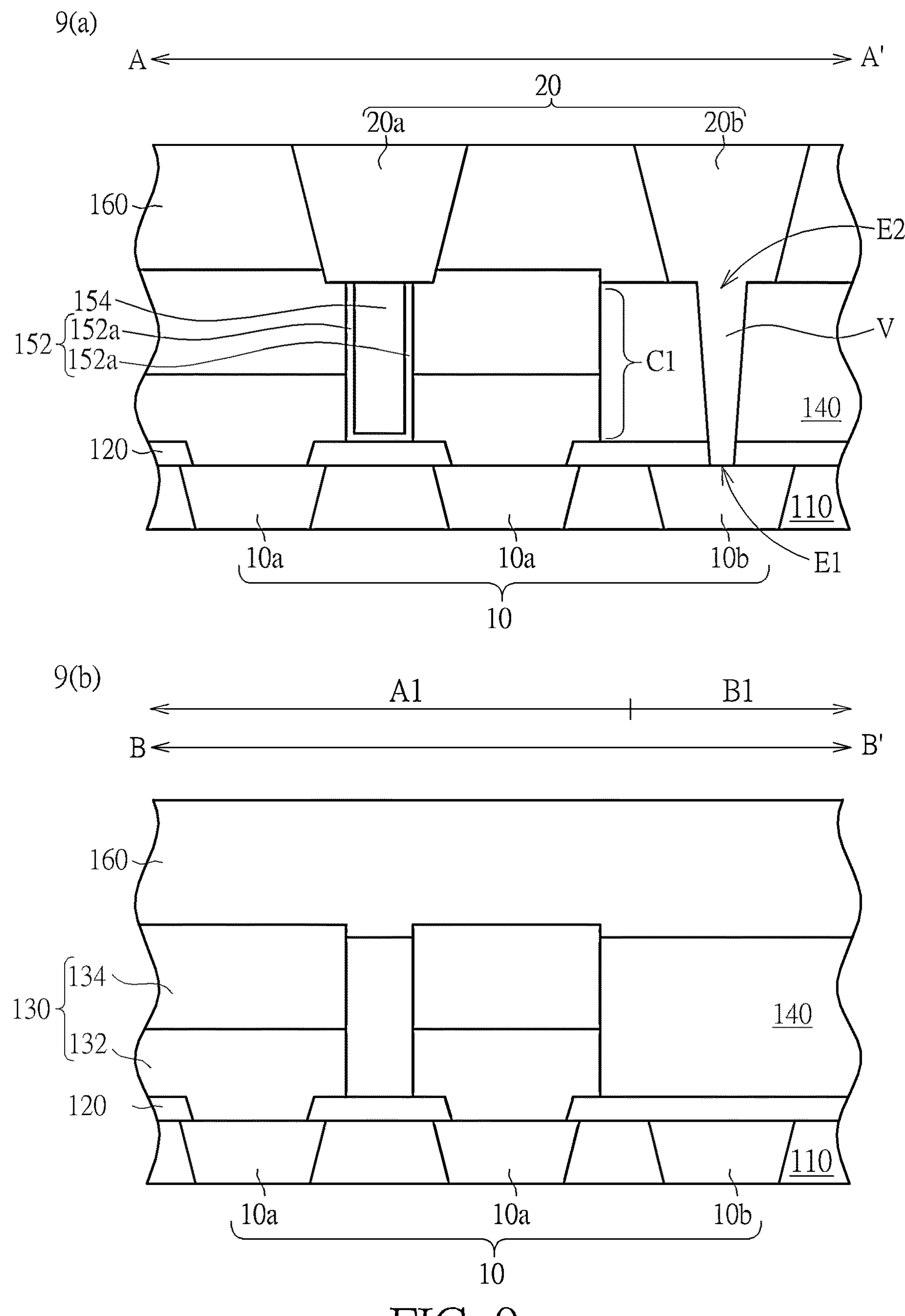
FIG. 9 schematically depicts a cross-sectional view of a method of forming a vertical resistive random-access memory (RRAM) device according to an embodiment of the present invention.

FIG. 9(*a*) is a cross-sectional view along line AA' of FIG. 8(*a*) after the step of FIG. 8(*b*), and FIG. 9(*b*) is a cross-sectional view along line BB' of FIG. 8(*a*) after the step of FIG. 8(*c*). As shown in FIG. 9, a via V is formed in the inter-dielectric layer 140 beside the RRAM cell C1, and the via V contacts the first metal structure 10. As shown in FIG. 9(*a*), the via V is formed beside the RRAM cell C1, but the RRAM cell C1 and the via V are not depicted in FIG. 9(*b*). Thereafter, a second metal structure 20 directly contacts the resistive material 152, the vertical top electrode 154 and the via V, wherein the second metal structure 20 may include a second metal line 20*a* directly contacting the resistive material 152 and the vertical top electrode 154, and a second metal line 20*b* directly contacting the via V. More precisely, a dielectric layer 160 may be blanketly deposited and patterned to include recesses (not shown) on the RRAM cell C1 and the via V, and metals fill into the recesses to form the second metal structure 20. The second metal line 20*a* and the second metal line 20*b* are formed at a same time by this method, but the present invention is not restricted thereto. Furthermore, parts of the vertical top electrode 154 and the resistive material 152 may be removed by over-etching while etching the dielectric layer 160 to form recesses (not shown), and thereby the second metal line 20*a* can be disposed in a part of the dielectric layer 134. Since the dielectric layer 134 is stacked on the bottom electrode lines 132, and the resistive material 152 has a U-shape cross-sectional profile surrounding the vertical top electrode 154, the resistive material 152 can be prevented from being damaged and the connecting of the bottom electrode lines 132 and the vertical top electrode 154 by the second metal structure 20 can be avoided while the second metal structure 20 is formed or the dielectric layer 160 is etched to form the recesses.

Above all, the RRAM cell C1 is constituted by the bottom electrode lines 132, the resistive material 152 and the vertical top electrode 154. Two of the bottom electrode lines 132 directly on the first metal structure 10. The inter-dielectric layer 140 is disposed on the first metal structure 10 beside the bottom electrode lines 132. The resistive material 152 is surrounded by the bottom electrode lines 132 and the inter-dielectric layer 140, and the vertical top electrode 154 is surrounded by the resistive material 152. In the first area A1, the bottom electrode lines 132 directly contact the first metal wires 10*a* of the first metal structure 10, and the resistive material 152 and the vertical top electrode 154 directly contact the second metal line 20*a* of the second metal structure 20. In the second area B1, the via V is disposed in the inter-dielectric layer 140 beside the RRAM cell C1, and two ends E1/E2 of the via V contact the first metal wire 10*b* of the first metal structure 10 and the second metal line 20*b* of the second metal structure 20 respectively. In this embodiment, the resistive material 152 has a U-shape cross-sectional profile, and the vertical top electrode 154 has an I-shape cross-sectional profile. By doing this, the RRAM cell C1 of the present invention includes two parallel resistive layers, meaning the two vertical parts 152 of the U-shape cross-sectional profile. This structure saves each cell area. By applying the method of forming the RRAM cell C1, the RRAM cell C1 of the present invention is embedded easily, and RRAM processes can be integrated into logic processes. Moreover, the resistive material 152 can be prevented from being damaged and the connecting of the bottom electrode lines 132 and the vertical top electrode 154 by the second metal structure 20 can be avoided while the second metal structure 20 is formed or the dielectric layer 160 is etched to form the recesses.

Figure 10:
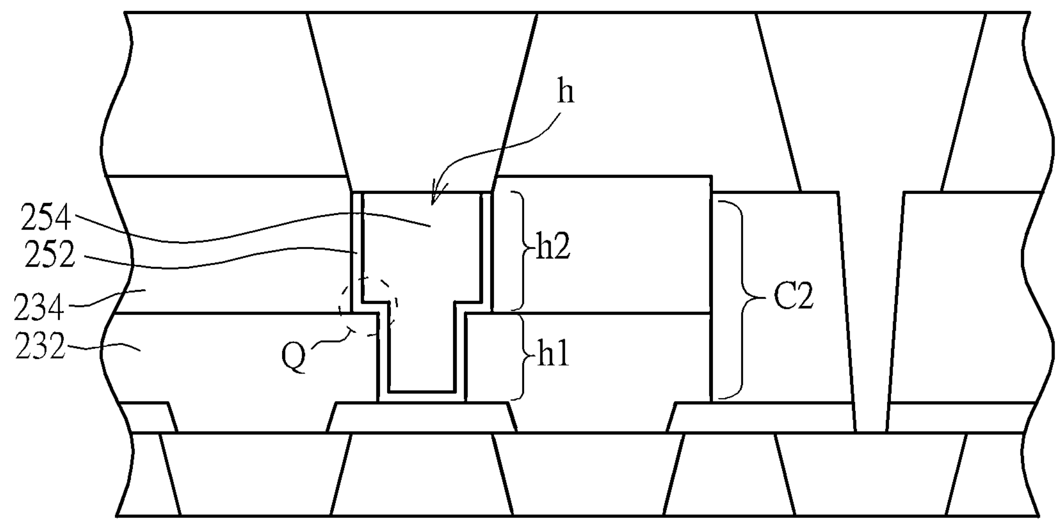
FIG. 10 schematically depicts a cross-sectional view of another vertical resistive random-access memory (RRAM) device according to an embodiment of the present invention.

The RRAM cell C1 including the resistive material 152 having a U-shape cross-sectional profile, and the vertical top electrode 154 having an I-shape cross-sectional profile, is presented. In another embodiment, another RRAM cell, which includes a vertical top electrode having a T-shape cross-sectional profile, is provided. FIG. 10 schematically depicts a cross-sectional view of another vertical resistive random-access memory (RRAM) device according to an embodiment of the present invention. As shown in FIG. 10, the vertical top electrode 154 of FIG. 9 is replaced by a vertical top electrode 254. A method of forming the structure of this embodiment is similar to the method of forming the RRAM cell C1. However, through holes h broaden from bottom to top are formed instead of the through holes H of FIG. 6, wherein an aperture of a through hole part h1 in a bottom electrode line 232 is less than an aperture of a through hole part h2 in a dielectric layer 234. Then, a resistive material 252 and the vertical top electrode 254 fill into the through holes h to form a RRAM cell C2 including the vertical top electrode 254 having a T-shape cross-sectional profile. Due to sharp corners Q being between the bottom electrode line 232 and the vertical top electrode 254, point discharge can reduce applied voltage and improve device stability.

Figure 11:
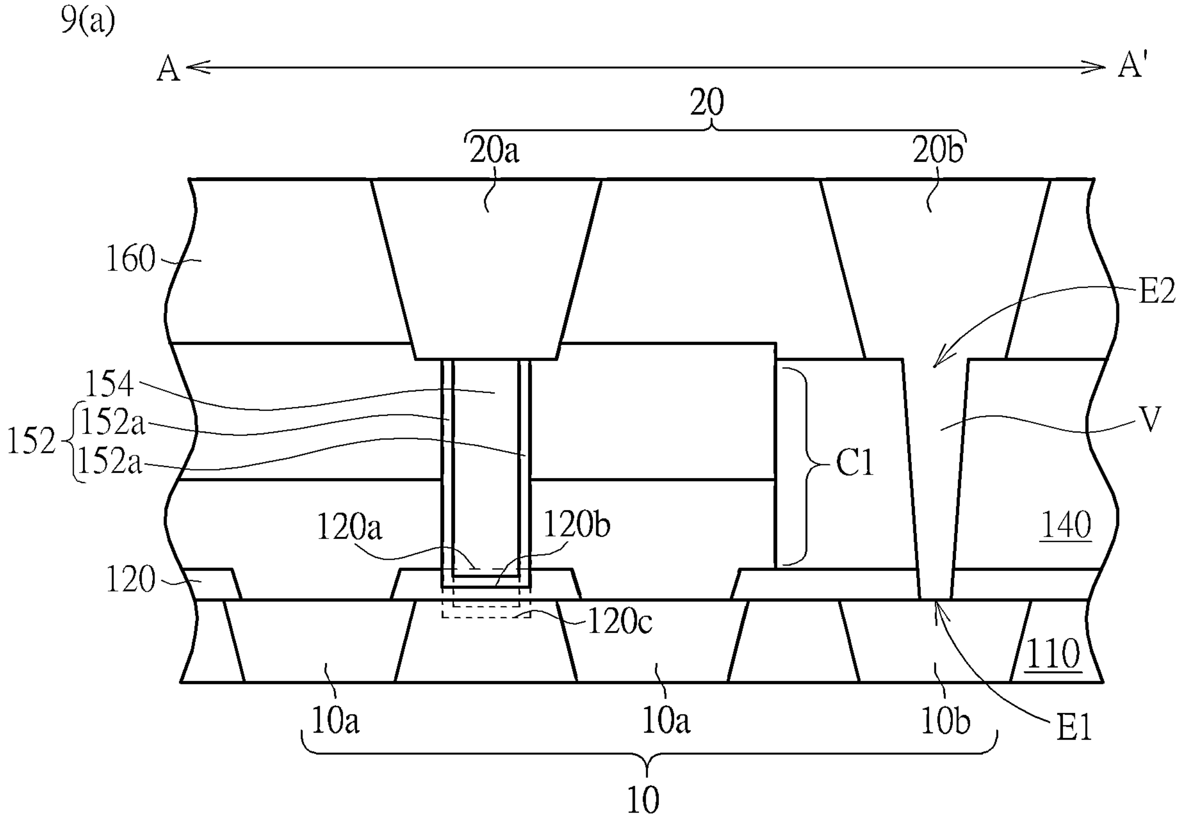
FIG. 11 schematically depicts a cross-sectional view of another vertical resistive random-access memory (RRAM) device according to an embodiment of the present invention.

FIG. 11 schematically depicts a cross-sectional view of another vertical resistive random-access memory (RRAM) device according to an embodiment of the present invention. The process of etching the through holes H of FIG. 6 may stop on the cap layer 120, to form a structure 120*a*. Or, a part of the cap layer 120 may be also etched to form a structure 120*b*. Or, the cap layer 120 may be etched through until a part of the dielectric layer 110 is etched to form a structure 120*c*.

To summarize, the present invention provides a resistive random-access memory (RRAM) device and forming method thereof, which forms two bottom electrode lines directly on a first metal structure, an inter-dielectric layer disposed between the bottom electrode lines, through holes surrounded by the inter-dielectric layer and the bottom electrode lines, a resistive material and a vertical top electrode sequentially filling in the through holes, to constitute a RRAM cell including the resistive material having a U-shape cross-sectional profile. In this way, the resistive material including two parallel resistive layers, meaning two vertical parts of the U-shape cross-sectional profile, can save each cell area. Moreover, the resistive material can be prevented from being damaged and the connecting of the bottom electrode lines and the vertical top electrode by an above metal structure contacting the RRAM cell can be avoided.

Furthermore, the vertical top electrode may have an I-shape cross-sectional profile or a T-shape cross-sectional profile. Preferably, the vertical top electrode having a T-shape cross-sectional profile has sharp corners to lead to point discharge, hence reducing applied voltage and improving device reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random-access memory (RRAM) device, comprising:
   - a bottom electrode line directly on a first metal structure;
   - a top electrode island disposed beside the bottom electrode line;
   - a resistive material sandwiched by a sidewall of the bottom electrode line and a sidewall of the top electrode island; and
   - a cap layer covering a portion of the first metal structure and under the bottom electrode line.

2. The resistive random-access memory (RRAM) device according to claim 1, further comprising a dielectric layer disposed on the bottom electrode lines, wherein the resistive material penetrates through the dielectric layer.

3. The resistive random-access memory (RRAM) device according to claim 2, wherein the dielectric layer comprises a silicon nitride layer.

4. The resistive random-access memory (RRAM) device according to claim 1, wherein the resistive material comprises transition-metal-oxide (TMO).

5. The resistive random-access memory (RRAM) device according to claim 1, wherein the resistive material has a U-shape cross-sectional profile.

6. The resistive random-access memory (RRAM) device according to claim 1, wherein the top electrode island has an I-shape cross-sectional profile or a T-shape cross-sectional profile.

7. The resistive random-access memory (RRAM) device according to claim 2, further comprising a second metal structure directly contacting the resistive material and the top electrode island.

8. The resistive random-access memory (RRAM) device according to claim 7, wherein the second metal structure comprises a first metal line and a second metal line disposed beside the first metal line.

9. The resistive random-access memory (RRAM) device according to claim 8, further comprising a via disposed beside the RRAM cell, wherein the via contacts the second metal line of the second metal structure directly.

10. The resistive random-access memory (RRAM) device according to claim 7, further comprising a second dielectric layer disposed on the dielectric layer, wherein the second metal structure disposed in the second dielectric layer.

11. The resistive random-access memory (RRAM) device according to claim 2, further comprising an inter-dielectric layer disposed beside the bottom electrode lines and the dielectric layer.

12. The resistive random-access memory (RRAM) device according to claim 11, wherein a top surface of the inter-dielectric layer is lower than a top surface of the dielectric layer.

13. The resistive random-access memory (RRAM) device according to claim 1, wherein a top surface of the cap layer is aligned with a bottom surface of the resistive material.

14. The resistive random-access memory (RRAM) device according to claim 1, wherein a top surface of the cap layer is higher than a bottom surface of the resistive material.

15. The resistive random-access memory (RRAM) device according to claim 1, wherein the resistive material penetrates through the cap layer.

16. The resistive random-access memory (RRAM) device according to claim 1, wherein a width of the cap layer is wider than a width of the resistive material.

* * * * *